United States Patent [19]

Knowles et al.

[11] Patent Number: 4,492,930

[45] Date of Patent: Jan. 8, 1985

[54] AUTOMATIC GAIN CONTROL SYSTEM

[75] Inventors: Robert C. Knowles, Ocala; Darrell R. Marshall, Palatka, both of Fla.

[73] Assignee: Microdyne Corporation, Ocala, Fla.

[21] Appl. No.: 310,959

[22] Filed: Oct. 13, 1981

[51] Int. Cl.$^3$ ............................................. H03G 3/30
[52] U.S. Cl. .................................. 330/284; 328/145; 330/278
[58] Field of Search .............. 330/278, 284; 328/145; 307/492

[56] References Cited

U.S. PATENT DOCUMENTS 4,376,267  3/1983  Chu et al. ............................ 330/278

FOREIGN PATENT DOCUMENTS 2037106  7/1980  United Kingdom ................ 330/284

Primary Examiner—James B. Mullins
Assistant Examiner—G. Wan
Attorney, Agent, or Firm—Howard L. Rose

[57] ABSTRACT

A system in which automatic gain control is not applied to modify an incoming carrier signal over the first 40 dB of signal level, employs an AGC system in which a further signal is generated for further modification of the modified carrier signal to obtain the original carrier signal modified by a linear logarithmic response to the AGC signal over the entire signal range of the apparatus. In addition, automatic gain control signals derived from both an envelope AM detector and a synchronous AM detector are added together whereby a continuous AGC signal is generated regardless of the source of the signal.

5 Claims, 4 Drawing Figures

AUTOMATIC GAIN CONTROL SYSTEM

RELATED APPLICATIONS

This application is related to patent application Ser. No. 311,114, filed on concurrent date herewith by Donald J. Woodworth and Gregory A. Maginn for Variable Phase Signal Demodulator and to patent application Ser. No. 311,109 filed on concurrent date herewith by Bryan W. Davis for Envelope Detector for Amplitude Modulated Signals both assigned to the same assignee as the present invention.

BACKGROUND OF THE INVENTION

The present invention relates to an automatic gain control circuit for radio receivers and more particularly to a circuit for correcting a discontinuous gain control function to provide a linear logarithmic gain control versus signal level function and a continuous AGC signal derived from both envelope and synchronous AM detectors.

The receiver with which the present invention is to be employed is a telemetry receiver for acquiring information from satellites and deep space probes in which high noise levels are quite common. In order to obtain a reasonably good noise figure over the most sensitive range of operation of the receiver, no gain correction is introduced by the tuner of the receiver over the lowest 40 dB range of signal levels to be received.

A problem arises from the fact that in the type of work with which such receivers are employed, it is often desired to record the information received for further processing at a later time. The AGC system described above, however, distorts the AGC curve due to the non-linearity introduced by suppression of AGC action in the tuner over approximately the first 40 dB range of signal levels. Specifically, even though the response of the system to the AGC signal, when invoked, is linear with respect to logarithmic carrier level, the fact that the AGC signal is ineffective at low carrier levels results in an overall non-linear logarithmic control function. Thus, the tuner does not provide undistorted AGC data for subsequent processing.

Another problem encountered in the receiver of the present invention results from the use of both envelope and synchronous AM detectors. The synchronous AM detector is employed to detect signals at levels as low as 20 dB below noise while the envelope detector does not operate normally below zero dB signal levels relative to noise. Thus, if the two signals were applied throughout the system, when the synchronous detector locked on the carrier, an AGC signal would be switched in indicative of a 20 dB jump in signal; i.e. receiver gain would be reduced by 20 dB. Such a rapid change in level is acceptable in some parts of the system. If it is desired to record the signal, as is the case in the environment to which such a receiver is applicable, the recording is rendered virtually useless.

BRIEF DESCRIPTION OF THE PRESENT INVENTION

In accordance with one feature of the present invention, an ancillary AGC signal is produced having a characteristic such that when applied to a gain controlled amplifier downstream from the tuner it corrects for the non-linearity of the response of the system to the AGC signal applied to the tuner and IF stage. More specifically, a further AGC signal is produced which, when applied to an amplifier, produces a signal output that, in effect, has been subjected to a linear logarithmic AGC control function over the operating range of the RF section of the receiver. The correction AGC signal referred to above is applied to a gain controlled IF amplifier of the signal processing system. In addition, the corrected AGC signal may be recorded concurrently with the signal output of the IF stages. In either instances the signal, as originally received by the tuner from the antenna or other original source, may be reconstructed for further processing.

The corrective function or AGC signal is derived from a circuit having a pair of amplifiers in parallel. The AGC signal applied to the tuner and IF stages of the receiver is also applied to the two amplifiers. A first amplifier of the pair is rendered non-operative over a range of AGC signals produced by the lowest 40 dB of incoming carrier signals. The second amplifier of the pair is conductive over the entire range. The gain of this second amplifier is such as to produce an AGC signal that varies linearly with logarithmic incoming carrier signal level. At the 40 dB above noise signal level, the output signal level of the second amplifier becomes a constant and the first amplifier becomes conductive; the output signal of the first amplifier being added to that of the second amplifier. The overall function is such that a linear logarithmic AGC response of the system over its entire operating range is produced.

In accordance with another feature of the present invention, the AGC signals derived from the envelope and synchronous AM detectors are not mixed except for special uses such as in an associated diversity combiner. The envelope AGC signal is used throughout the receiver except in the synchronous detector for gain control purposes. Specifically, the envelope AGC signal controls gain of the tuner, IF stages, AM envelope detector, etc.

The synchronous detector AGC signal is, of course, employed in the synchronous AM detector, see the copending application for Variable Phase Signal Demodulator, and in accordance with still another feature of the present invention, is combined after appropriate scaling with the envelope AGC signal for use in a combiner, chart recorder, signal strength meter, and if desired, for certain other special functions in the receiver. The scaling action permits the sudden switch from envelope to synchronous detector without an abrupt change in AGC signal, i.e. a continuous function is provided.

It is one object of the present invention to provide a corrective AGC signal for use in a receiver wherein the tuner does not respond to the AGC signal over the lowest 40 dB of signal levels, whereby the corrective AGC signal may be applied to a gain controlled amplifier downstream from the tuner to produce an output that, in effect, has been subjected to a linear logarithmic AGC control function.

Another object of the present invention is to provide an AGC control system for a receiver having envelope and synchronous AM detectors wherein the synchronous detector detects signals at carrier levels 20 dB below noise and the envelope detector does not detect signals below the zero dB level, which AGC control system utilizes the AGC signal produced by the AGC circuit associated with the synchronous AM detector for only control of the synchronous AM detector and wherein the envelope detector AGC is employed to control tuner, IF amplifier, the envelope AM detector and related function; and wherein the envelope AGC and a scaled synchronous AGC are combined for control of external circuits and signal level displays.

DETAILED DESCRIPTION OF THE PRESENT INVENTION

Figures 1, 2A:
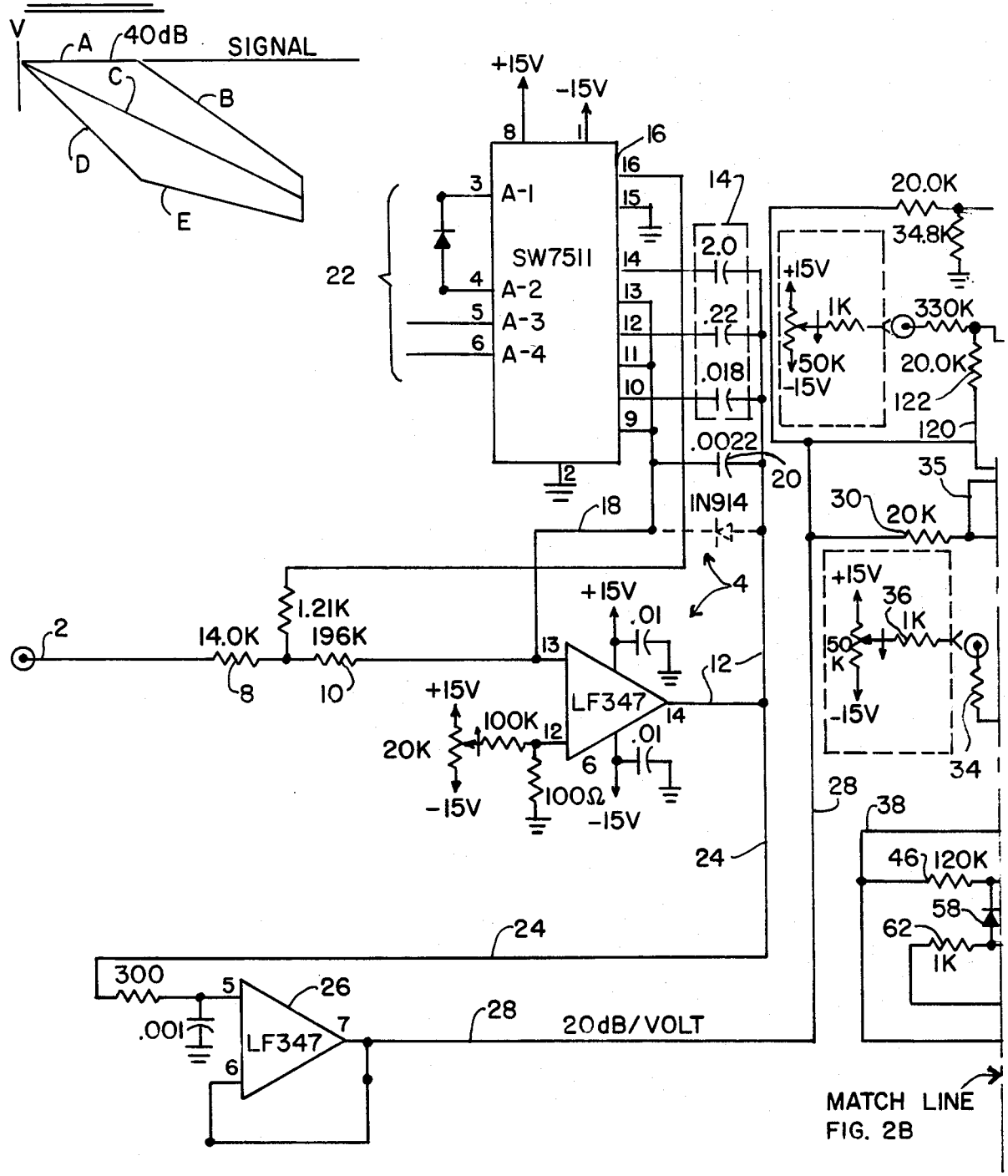
FIG. 1 is a graph illustrating the AGC function to be performed by the apparatus of the present invention.
FIGS. 2A–2C is a circuit diagram of the AGC circuits of the present invention.

Referring specifically to FIG. 1 of the accompanying drawings, there is illustrated a graph for determining the AGC function to be performed by the apparatus or circuits of the present invention. Specifically, the AGC response of the tuner for amplitude modulation levels of 0 to 40 dB, is zero. In other words, the tuner gain is not varied over this range of signals. Over the remainder of the range, about an additional 60 dB of signals, the response of the system to the AGC voltage, is linear with logarithmic signal level. The graph is plotted in the fourth quadrant since the AGC circuits of the present invention operate with negative voltages and it is more convenient to illustrate the AGC function as a negative going function since it can be directly correlated to output voltages in the circuit.

The response to the tuner from 0 dB to 40 dB is illustrated by line A, and the tuner response from 40 dB to 100 dB of signal strength is illustrated by graph or line B of FIG. 1. A linear response of AGC over the entire 100 dB operating range is illustrated by curve or line C of FIG. 1. In order to compensate for the deviation from the linear curve C, compensation must be in accordance with a discontinuous function represented by curves D and E. Specifically, the curve D has a slope so that at the 40 dB point, the curve C has been approximated; the slope of line D obviously being twice that of Curve C. The curve of line E represents the AGC function required to maintain the constant slope C over the portion of the system AGC represented by the line B.

An analysis of FIG. 1 determines that the curve D must be a function of a relatively high gain over the first 40 dB of operation whereas the gain of the system of the AGC correction function-producing circuits must have a lesser slope or gain over the 40-100 dB range.

Figure 2B:
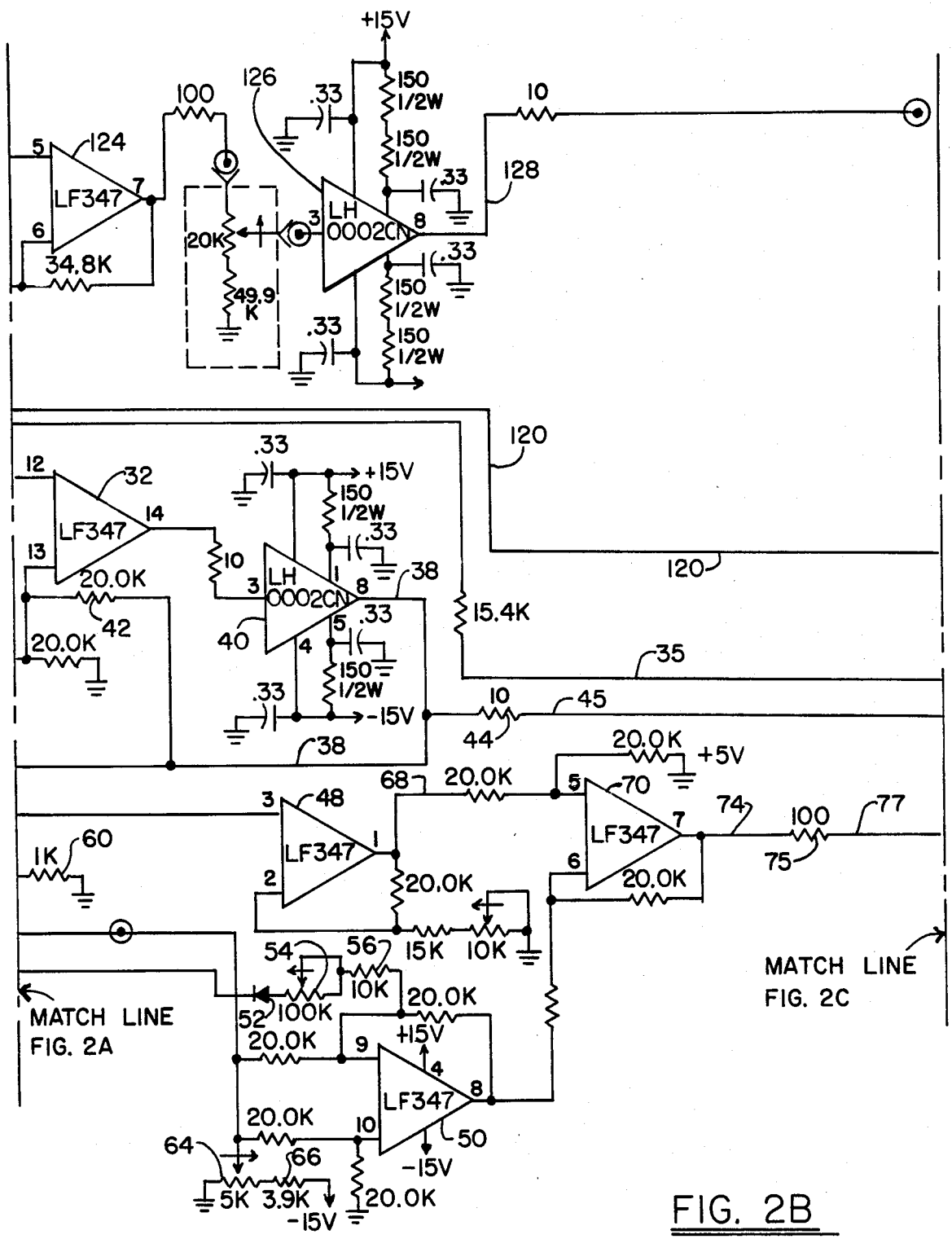
Figure 2C:
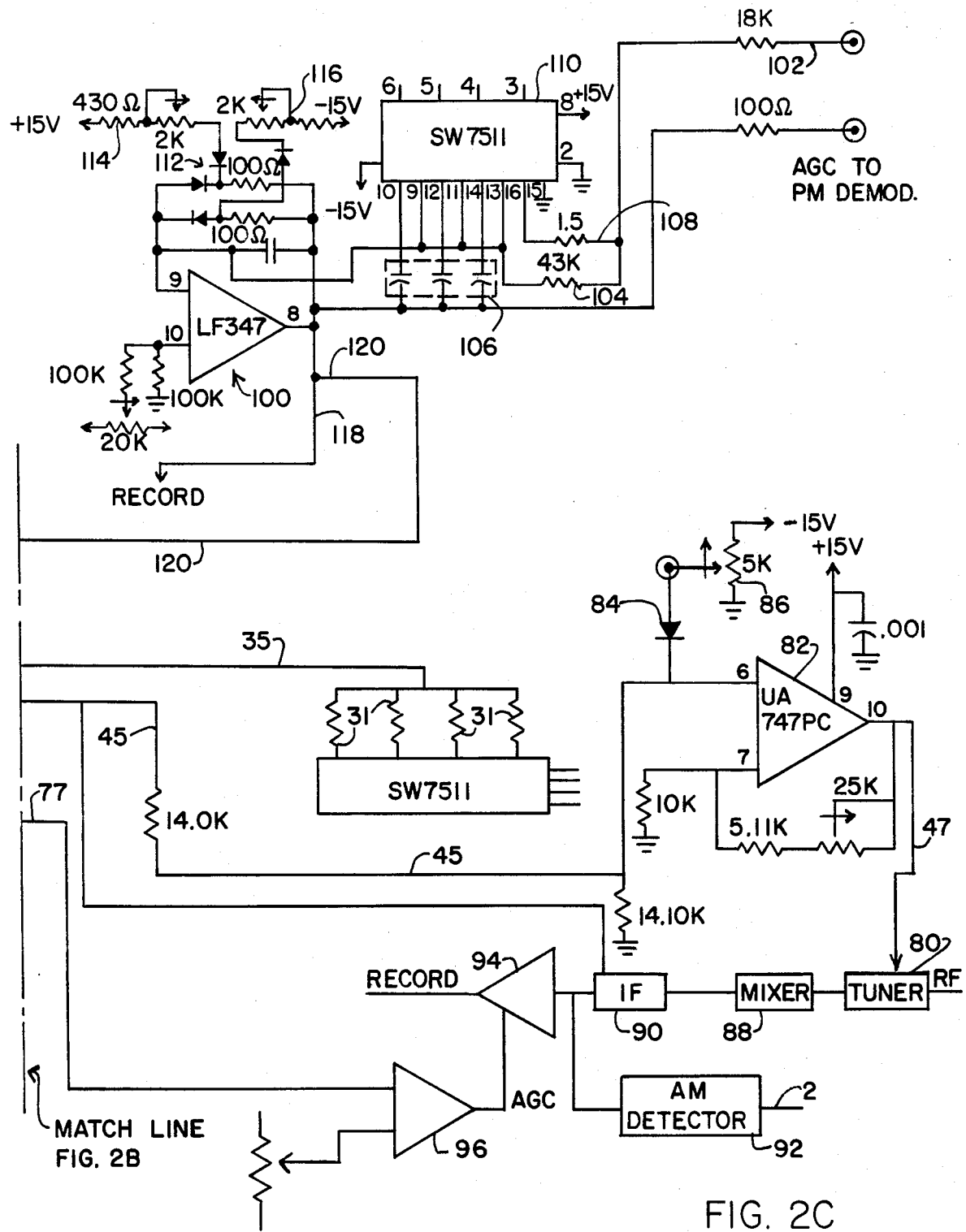

Referring now specifically to FIGS. 2A–2B of the accompanying drawings, there is illustrated the AGC circuits employed in the present invention. An AM signal from an AM detector is supplied to a lead 2 of the AGC signal. This circuit is derived from the terminals labeled "Envelope AM to AGC Sensor" of the single figure of the aforesaid application Ser. No. 311,114 entitled Envelope Detector for Amplitude Modulated Signals. The signal on lead 2 is supplied to an AGC integrator generally designated by the reference numeral 4 and comprising a differential amplifier 6 for receiving the signal on the lead 2 via the resistors 8 and 10.

Signals produced by the amplifier 6 are applied via a lead 12 to one side of a plurality of different value capacitors generally designated by the reference numeral 14. Each of the capacitors 14 is connected to a different pin of an integrated circuit switch 16, a FET switch designated as an SW7511. The FET switch 16 selectively connects one of the capacitors 14 from the lead 12 to a lead 18 connected to the same input terminal to the amplifier 6 as the signal appearing on the lead 2. Also connected between leads 12 and 18 is a further capacitor 20 which is always connected in the circuit and establishes a basic time constant for the integrator 4.

The time constant may be varied by inserting in parallel with the capacitor 20, one or more of the capacitors 14. Exclusion of all the capacitors 14 or the inclusion of one or more of them is determined by digital input signals applied to various switching input terminals designated A1, A2, A3, and A4 of the FET switch 16. As indicated in the copending application, Ser. No. 311,114, entitled Variable Phase Signal Demodulator, the receiver with which the apparatus of the present invention is primarily designed to operate is controlled from a master programming unit of a computer, the MPU selecting a specific time constant of the integrator in accordance with the desired AGC response of the system. It is the function of the AGC integrator 4, as is common in all the AGC circuits, to provide an integrated signal which, within the prescribed or selected time constant, varies as a function of the level of the incoming carrier as determined by the AM envelope detector of the aforesaid application Ser. No. 311,114 of Bryan W. Davis.

The signal appearing on the lead 12 is also applied via a lead 24 to an amplifier 26 producing on its output lead 28, a signal which varies 20 dB per volt. The signal on the lead 28 is applied via resistor 30 to pin 12 of an amplifier 32 having applied to its pin 13 via a resistor 34 a zero level adjust signal derived from a potentiometer 36 connected between −15 volts and +15 volts. The function of the signal level zero adjust is to produce, on an output lead 38 from amplifier 40 which receives a single-ended input from the amplifier 32, a signal equal to zero when the input signal level on the lead 28 is zero; i.e. there is no signal on the lead 28. It will be noted that the output appearing on the lead 38 is applied via resistor 42 to pin 13 or the negative input terminal of the amplifier 32, the reason for this being that under these circumstances, the signal level zero adjust provided by the potentiometer 36 adjusts for zero on the output lead 38 and not just on the output lead of the amplifier 32. Otherwise, the output voltage from the driver amplifier 40 might drift somewhat relative to the desired zero output function.

As the IF bandwidth of the receiver changes, there will normally be a shift of the output signal from the amplifier 40 with respect to zero input signal. This shift is compensated in accordance with the present invention by a plurality of resistors 31 any one of which can be selected individually by a FET switch 33 which also is controlled from the master programming unit as a function of selected bandwidth of the apparatus. Other appropriate selection means may also be employed. The resistors are connected via a lead 35 to the junction of the resistor 30 and pin 12 of the amplifier 32 acting as a signal bypass whereby the input signal to the amplifier 32 for a given output from the amplifier 26 is varied as a function of the inserted bank of resistors 31. Since the various bandwidths of the system are predetermined, the shift of zero output for each bandwidth can be readily determined and an appropriate compensating resistor 31 provided therefor.

The output signal appearing on the lead 38 is also applied via a resistor 44 to the tuner 80 and second IF stage of the receiver disclosed in the aforesaid application Ser. No. 311,114, Variable Phase Signal Demodulator and is discussed subsequently.

The signal on the lead 38 is applied via a resistor 46 to terminal 3 of an amplifier 48 and via various circuits to be described subsequently to the negative input terminal, pin 9, of amplifier 50. Specifically, the signal on the lead 38 is applied via a diode 52, the resistance card of a potentiometer 54, and a further resistor 56 to the pin 9. The input terminal 3 of the amplifier 48 is connected via a diode 58 to ground through a resistor 60. The anode of the diode 58 is connected via a resistor 62 to the slider of a potentiometer 64 having one end of its resistance card connected to ground and the other end connected through a resistor 66 to −15 volts.

The purpose of the potentiometer 64 is to set the negative voltage on the anode of the diode 58 so that the diode does not start to conduct until the input signal exceeds −2 volts. Specifically, over the range of 0 to −2 volts, the switching diode 58 is not conductive and the full value of the signal is applied to the pin 3 and is passed through the amplifier 48 to a lead 68 connected to pin 5 on amplifier 70. The gain of the amplifier 48 is determined by potentiometer 72 connected to the pin 2 of the amplifier. The gain of the amplifier 48 must be such as to provide an output voltage versus input function as determined by curve D of FIG. 1.

At the −2 volt level of the input signal, the diode 58 becomes conductive so that the signal appearing on the pin 3 does not rise beyond the 2 volt level and the output of the amplifier 48 becomes constant. At the −2 volt level, the diode 52 becomes conductive and applies an input signal to pin 9 of the amplifier 50. The gain of the amplifier 50 is such as to follow a slope parallel to the slope of curve E of FIG. 1. The output of the amplifier 50 is added to that of the amplifier 48 in the amplifier 70 so that the output voltage appearing on lead 74 of the amplifier 70 now follows the curve E as illustrated in FIG. 1. Thus, the discontinuous curve D-E is produced. If applied to an amplifier through which a signal output from the IF of the receiver which has an AGC signal applied as represented by curve B, the total AGC function applied to such signal is represented by the curve C.

In summary, the AGC signal applied via resistor 44 to output lead 45 is applied to a tuner of the receiver with which the device is employed and the tuner does not respond to the voltages appearing thereon representative of the first 40 dB of input signal level. Substantially the same voltage, however, that is applied to the lead 45 is applied via the lead 38 to the shaping circuit constituting amplifiers 48, 50 and 70 and associated circuits whereby the signal may be developed on output lead 77 via resistor 75 from the amplifier 70 which, when appropriately employed, compensates for the lack of the response of the tuner to that first 40 dB of AGC signal thereby to provide a linear AGC function.

Specifically, the tuner, designated by reference numeral 80, includes a delay AGC amplifier 82 receiving the signal on lead 45 on its pin 6. A diode 84 has its anode connected to the side of a potentiometer 86 which sets the voltage at which the diode 84 is turned off. When the voltage on lead 45 exceeds −2 volts, the diode 84 becomes non-conductive and the amplifier 82 provides a voltage via lead 47 to the AGC control of the tuner 80 which voltage varies linearly with dB carrier level over the AGC interval.

The output of the tuner 80 is applied to a mixer 88 and IF amplifier 90 feeds gain controlled amplifier 94 and demodulator and record amplifiers, not illustrated. The AM detector 92 provides the AGC sense signal on lead 2 of FIG. 2A.

The AGC correction voltage on lead 77 is applied via amplifier 96 to the gain control circuit of gain controlled amplifier 94 to provide the desired correction.

Referring now to the circuits for combining the AGC signals from envelope and synchronous AM detectors, the synchronous AGC signal from lead 62 of FIG. 3C of the aforesaid application for Variable Phase Signal Demodulator wherein the AGC signal has had its level shifted to zero level for input to integrator amplifier 100 via lead 102 and resistor 104. Integration time constant is controlled by selection of one of three capacitors 106 and an additional resistor 108 by means of switch 110. Switch 110 is under control of the operator via the MPU of the receiver illustrated in FIG. 1 of the aforesaid Variable Phase Signal Demodulator application. The four diodes 112 in conjunction with potentiometers 114 and 116 clamp the output of the amplifier 100 so that it cannot exceed a desired level in the event of loss of lock. The circuits described above are details of the circuit found in block 178 of the aforesaid FIG. 3C of application Ser. No. 311,114. It is to be noted that amplifier 174 of FIG. 3C of the aforesaid Woodworth application constitutes the prescaler required to set (scale) the signal level on lead 62 to zero for a desired zero AGC output level.

The output signal from the amplifier 100 is applied via lead 118 to recording processing circuits and is also applied via lead 120 and through resistor 122 to pin 6 of amplifier 124. The envelope AGC signal is applied via lead 28 to pin 5 of amplifier 124. The amplifier 124 adds the two AGC signals which are further amplified by amplifier 126 and may be applied to a combiner via lead 128 on which the output from the amplifier 126 appears.

Although the apparatus of the invention is described with respect to a particular receiver and a function relative to such receiver, it is apparent that the concepts of apparatus may be utilized with any equipment in which a discontinuous AGC response is desired for at least a part of the circuit operation to thereby produce the signals which may be acceptable for other applications related to the same received signal.

Once given the above disclosure, many other features, modifications and improvements will become apparent to the skilled artisan. Such other modifications, features and improvements are, therefore, considered a part of this invention, the scope of which is to be determined by the following claims.

I claim:
1. An automatic gain control system comprising:
    a first controlled amplifying means for producing an output signal that is a function of a varying amplitude carrier input signal,
    a second controlled amplifying means for producing an output signal that is a function of a varying amplitude carrier input signal,
    an automatic gain control circuit for producing a first gain control voltage which varies as a function of the amplitude level of the input carrier signal,
    said amplifying means including means for varying the gain of said amplifying means as a function of the first gain control voltage only above a prescribed voltage level greater than 0,
    means for applying said first gain control voltage to said first amplifying means,
    said automatic gain control circuit further comprising means for generating a further gain control voltage for establishing a linear logarithmic relationship between the gain control voltage and the varying amplitude input carrier signal applied to said gain controlled amplifying means over the entire operating range of said amplifying means, means applying said further gain control voltage to said second amplifying means.

2. In a signal processing system having an input carrier with a varying amplitude level and a first automatic gain control circuit operative to provide a first gain control signal and an amplifying system that is unresponsive to the gain control signal over a predetermined initial amplitude range of the input carrier less than the entire range and responsive thereto over the remaining amplitude range of the gain control signal, said automatic gain control circuit comprising:

a receiver having a tuner and an IF amplifier, means for generating a further gain control voltage, a further amplifying system having a signal input and a gain control input, means applying said further gain control voltage to said gain control input and the output signal produced by the first mentioned amplifying system to the signal input of said further amplifying means, said further gain control voltage controlling the gain of said further amplifying system to provide a linear gain control signal level versus logarithm of carrier signal level over the entire range of operation of the amplifying systems which does not vary in slope as a function of receiver gain control range change due to IF bandwidth changes in the IF amplifier.

3. The system according to claim 2 wherein said means for generating a further gain control voltage comprising:

a first amplifier, a second amplifier, means applying the output gain control signal for the first mentioned amplifying system to said first and second amplifiers in parallel, means rendering said second amplifier unresponsive to the signal produced by the first mentioned amplifying system over the predetermined initial region of the range of operation of the automatic gain control circuit, said first amplifier producing over the initial region of the predetermined range an output signal having a slope much greater than that produced by the first automatic gain control circuit and a constant output voltage over the remainder of the predetermined range, said second amplifier producing an output voltage over the remainder of the predetermined range to provide said linear gain control versus logarithmic carrier function.

4. In an automatic gain control system in which a first amplifying means for a carrier is unresponsive to the automatic gain control signal over an initial region of the gain control signal and linearly logarithmic responsive over the remainder of the operative range of the automatic gain control system, means for producing a carrier signal having amplitude variations that are the result of having been subjected to amplification by said first amplifying means unresponsive to the automatic gain control voltage over a predetermined range of carrier amplitude variations, a further amplifier means having a gain control input, the carrier signal produced by the first-mentioned amplifying means being applied to said further amplifying means, a further automatic gain control circuit for producing an output voltage that is a mirror image of the discontinous response of said first-mentioned means about a linear response of the system over the predetermined range of response of the system, said output signal being applied to the gain control input of said further amplifier means to provide a linear logarithmic relationship between the gain control voltage and the input carrier signal.

5. An automatic gain control system for generating a discontinuous gain control function and producing a correction signal to also produce a linear logarithmic gain control signal versus input signal level function, said system comprising:

means for generating a first gain control signal that remains constant over a first predetermined initial low range of signal levels and which varies as a linear logarithmic function of a second range of signals above and continuous with said low range of signal levels, means for generating a second gain control signal, a first amplifying means, a second amplifying means, means for applying the input signal and said first gain control signal to said first amplifying means such that the input signal is amplified in accordance with an amplifier gain that is varied as a function of said first gain control signal, and means for applying the output of said first amplifying means to said second amplifier, said second gain control signal being applied to a gain control circuit of said second amplifier and being such that the output signal of said second amplifying means is a linear logarithmic function of the input signal level.

* * * * *